United States Patent [19]

Dumke et al.

[11] Patent Number: 4,518,979
[45] Date of Patent: May 21, 1985

[54] SEMICONDUCTOR TRANSISTOR WITH GRADED BASE AND COLLECTOR

[75] Inventors: William P. Dumke, Chappaqua; Jerry M. P. Woodall, Bedford Hills, both of N.Y.

[73] Assignee: International Business Machines Corporation, Armonk, N.Y.

[21] Appl. No.: 393,923

[22] Filed: Jun. 30, 1982

[51] Int. Cl.³ .......................................... H01L 27/14
[52] U.S. Cl. ........................................ 357/30; 357/16
[58] Field of Search ........................ 357/16, 13, 30, 15, 357/34, 19, 17

[56] References Cited

U.S. PATENT DOCUMENTS

| | | | |
|---|---|---|---|
| 3,081,370 | 3/1963 | Miller | 136/89 |
| 3,995,303 | 11/1976 | Nahory et al. | 357/30 |
| 4,075,651 | 2/1978 | James | 357/22 |
| 4,096,511 | 6/1978 | Gurnell et al. | 357/30 |
| 4,122,476 | 10/1978 | Hovel et al. | 357/16 |
| 4,160,258 | 7/1979 | Dawson et al. | 357/16 |
| 4,275,404 | 6/1981 | Cassiday et al. | 357/17 X |
| 4,383,269 | 5/1983 | Capasso | 357/13 X |

OTHER PUBLICATIONS

Ankri et al, "Design and Evaluation of a Planar GaAlAs-GaAs Bipolar Transistor", *Electronics Letters*, vol. 16, No. pp. 41-42, Jan. 1980.

Dumke, W. P., "Use of Heterojunctions as Emitter Contacts in High Gain, High Speed Si Transistors", *IBM Tech. Discl. Bull.*, vol. 20, No. 4, Sep. 1977, pp. 1614-1615.

Konagi et al, "Graded Bandgap $pGa_{1-x}Al_xAs$-n GeAs Heterojunction Solar Cells", *J. Appl. Phys.*, vol. 46, No. 8, pp. 3542-3546, Aug. 1975.

Mizuki et al, "$pIn_xGa_{1-x}Sb$-$nGa_{1-y}Al_y$ sb Heterojunction Photodiode", *Proc. 11th Conf. Solid State Dev., Jap. J. Appl. Phys.*, vol. 19, Suppl. 19-1, pp. 383-387, (1980).

Suilans et al, "Sensitive GaAlAs/GaAs Wide Gap Emitter Phototransistor for High Current Applications", *IEEE El. Dev. Lett.*, vol. EDL-1, No. 12, pp. 247-249, Dec. 1980.

*Primary Examiner*—Martin H. Edlow
*Attorney, Agent, or Firm*—Alvin J. Riddles

[57] ABSTRACT

A semiconductor processor for signals such as are conveyed by fiber optics wherein the processor structure accommodates lattice mismatch and minimizes the effect of misfit dislocations. The structure permits using materials having favorable absorption properties at the 1 micrometer wavelength of optical signals. A binary semiconductor is employed with graded regions produced by adding a different third ingredient in two places so that a wide band optically transparent emitter with a graded base and graded collector are provided. The ingredients impart a strong absorption in the optical signal wavelength together with superior semiconductor carrier transit time. A structure for a silicon and germanium oxide based optical signal fiber uses a GaAlAs emitter, a base that is graded to $Ga_{0.25}In_{0.75}As$ at the collector and then back to GaAs at the substrate.

8 Claims, 2 Drawing Figures

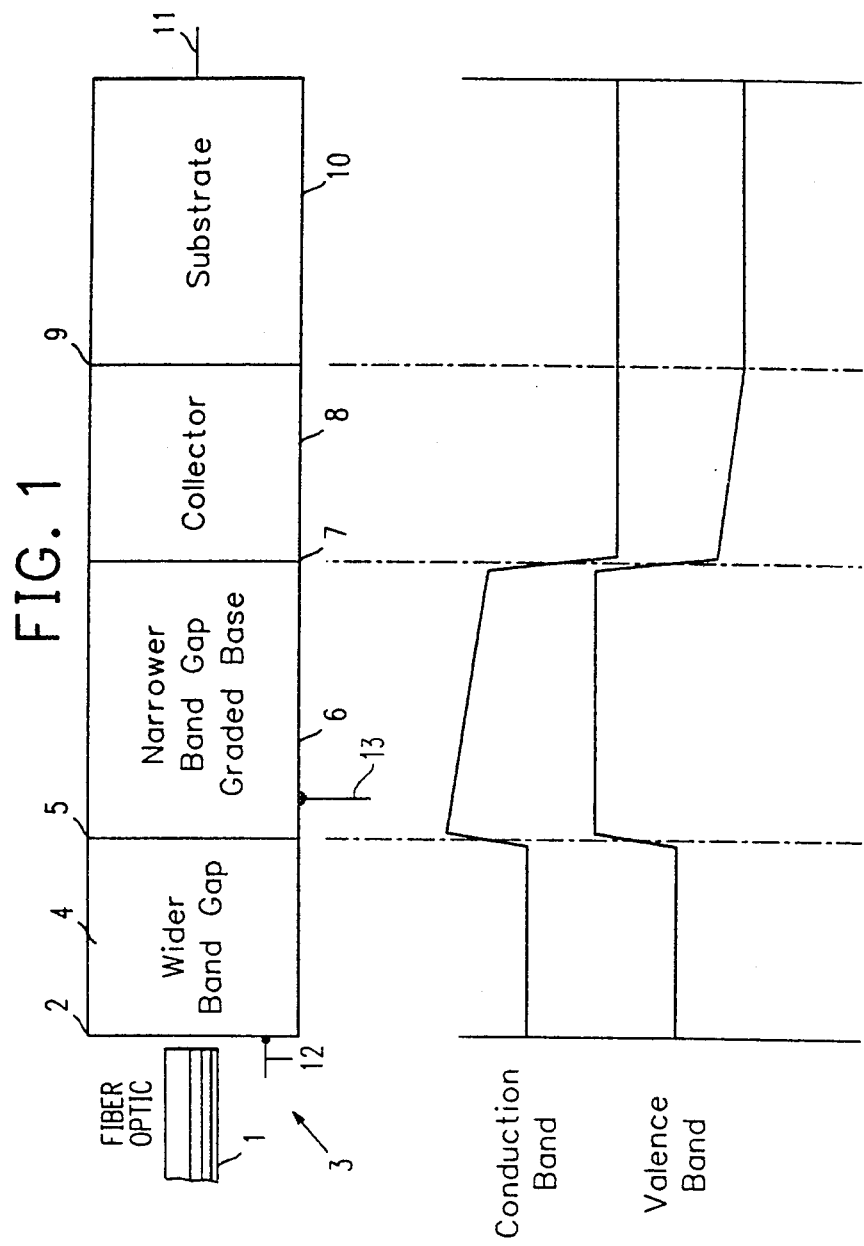

SEMICONDUCTOR TRANSISTOR WITH GRADED BASE AND COLLECTOR

DESCRIPTION

1. Technical Field

The technical field of the invention is in the transmission and detection of signals in a semiconductor device wherein internal losses of carriers produced by the signal are minimized within the device. Where the signals are in the optical range, the semiconductor device may be optimized for the system in which it operates. As an illustration, it is desirable for optical signals to perform the conversion at an optical signal wavelength at which the absorption during transmission of the optical signal is very low. However, in optical signal conversion, there are limitations on efficiency by the available light output frequencies of the signal generating equipment, by the attenuation of the light signal by the transmission medium and by the detector which re-converts the optical signal.

2. Background Art

Most work in this field has been directed to the conversion of electrical to optical signals, transmission in air or along quartz based optical fiber materials and reconversion of the optical signal to an electrical signal. As the art is developing, there are advantages in being able to have flexibility in optimizing various aspects of the system.

It has been known that photodetectors having a rapid response time and sensitivity in the wavelength region of around 1 micron or 1 to 1.4 electron volts are desirable and that these parameters can be somewhat achieved by having a photodetector with a wide band gap emitter region. Such a structure is shown in U.S. Pat. No. 4,122,476.

The material InAs has been shown to be a good detector material for wavelengths above 0.86 micrometers as described in U.S. Pat. No. 4,096,511.

In general semiconductor practice, the advantages of providing a wide band gap emitter together with a gradient field in the crystal by doping to enhance carrier transport is illustratively described in U.S. Pat. No. 3,081,370.

DESCRIPTION OF THE DRAWINGS

FIG. 1 is a schematic illustration of the regions of the semiconductor body of the invention.

FIG. 2 is a dimensionally correlated energy diagram for the structure of FIG. 1.

DISCLOSURE OF THE INVENTION

The invention involves a signal conversion semiconductor structure wherein through the use of layers of multiple elemental semiconductor materials with common elements, signal transfer gains, lattice mismatch accommodation and carrier transport gains are achieved. The variation of elements provides lattice accommodation which minimizes carrier traps due to dislocations and a graded band gap which due to the accelerating effect on the carriers minimizes the effect of any dislocation carrier traps that do occur.

The structure and advantages will be explained in connection with the conversion of optical signals although in the light of the principles set forth, use of the structure of the invention for electrical signal conversion will be readily apparent.

Referring to FIG. 1, the optical signal is delivered through an element 1, illustrated as an optical fiber, to a light receiving surface 2 of a semiconductor body 3. The semiconductor body 3 has an emitter region 4 of a wider band gap semiconductor material than the base region. The region 4 forms an emitter-base p-n junction 5 with a graded band gap base region 6 wherein the grading is from a wider band gap at the interface 5 to a narrower band gap at the base to collector p-n junction 7. The collector region 8 is epitaxial at the interface 9 with the substrate 10 and may be provided with a graded band gap for carrier influencing purposes and for lattice accommodation purposes with the substrate 10. An external electrical connection 11 is made to the substrate 9, an external electrical connection 12 is made to the surface 2 to transmit the detected electrical signals and an external electrical connection 13 is provided to the base region 6 to drain holes from the base region and for a base contact if electrical signals are being converted.

Referring to FIG. 2, there is shown the band energy diagram correlated with the regions of the device of FIG. 1. In the emitter region 4 the wide band gap coupled with the smaller band gap in the base region provides high emitter injection efficiency. The graded band gap in the base region 6 provides a field to accelerate injected carriers to the collection p-n junction and to reduce carrier recombination at dislocations whose density is intolerably large for large lattice mismatch materials. In certain embodiments, the graded band gap in the collector reduces misfit dislocations at the interface 9 with the substrate 10.

A four-layer structure is provided. A wider band gap semiconductor emitter region than the band gap of the base region is employed so that the light will penetrate to the base region without significant absorption yet the injection efficiency of carriers into the base and potential current gain of the device will be high.

The material in the base region is selected for optical conversion properties at the selected wavelength and will be provided with a graded band gap so as to produce a strong effective drift field in the base to accelerate carriers toward the collector and to reduce carrier recombination at dislocations where density is intolerably high in large lattice mismatched materials.

Materials with large lattice mismatches are those which exhibit a change of more than 1% in lattice constant over the entire range of allowed composition change for the material. For example, the lattice constants of GaAs and GaP are 5.663 and 5.451, respectively. Thus, the percent difference in lattice constant for this system is 3.6% and therefore $GaAs_{1-x}P_x$ would be a large lattice mismatch system. It is known that materials with large dislocation densities, i.e., $>10^6-10^7$ cm$^{-2}$ exhibit enhanced carrier recombination at dislocation sites with recombination lifetimes of $\approx 10^{-9}$ to $10^{-10}$ sec. It is also known that materials with a large lattice mismatch, e.g., $GaAs_{1-x}P_x$ exhibit enhanced dislocation type carrier recombination especially for material grown on lattice mismatched substrates, e.g., GaAs.

In this invention, the steeply graded base layer overcomes this limitation. If the base layer contains a high density of dislocations, the drift field produced by grading is sufficient to sweep the carriers across the base-collector junction reducing the recombination by the mechanism involving dislocation sites. For example, the transit time for a carrier transversing a 1 $\mu$m graded base at a velocity of $\approx 10^7$ cm/sec is $10^{-11}$ sec. The dislocation recombination lifetime is about $10^{-9}$ to $10^{-10}$ sec. Thus, the ratio of transit time to carrier recombination lifetime is 0.1 to 0.01 which means that 10 to 100 times more carriers will cross the base-collector junction than will recombine at dislocation sites.

In addition, grading composition in both the base and collector region reduces the detrimental effects of lattice mismatch, i.e., grading reduces the dislocation density. Reducing the dislocation density reduces noise due to carrier generation-recombination centers associated with those dislocations.

In the collector region the material varies in composition so as to accommodate lattice differences between the material of the base and a substrate material.

The structure of the invention will provide strong absorption in the base region for any light for the photon energies between the smallest band gap of the base region and the band gap of the emitter and the effective drift field will be such that electrons will move at something approaching the peak electron velocity of around $5 \times 10^7$ centimeters per second with a base transit time of around one picosecond. As a result, for a given base transit time, the gain obtained will be larger than that obtainable without a graded base.

BEST MODE FOR CARRYING OUT THE INVENTION

A preferred embodiment of the invention would involve the delivery of the optical signal by way of an optical fiber and to use selective grading of the ingredients of binary to ternary semiconductors in the base and collector regions to produce the drift field for the carriers and to accommodate the lattice matching with the substrate. In such a system, the optical fiber 1 would be of a material which would have low absorption at the light wavelength involved. The light signal generator is preferably a solid state electrical to light converting device such as a laser.

A local minimum in light absorption occurs at a 1.3 micrometer wavelength. There are available (In,Ga)(As,P)-InP lasers which radiate at such wavelengths. It has also been found that there is a better absorption band around 1.59 to 1.60 micrometers and tailored light sources coupled with optical fibers operating in this region will produce less loss. Examples of optical fiber materials suitable for operation at this wavelength are $SiO_2$, $GeO_2$ and a glassy mixture of germanium and silicon oxides. The optimum wavelength is somewhat influenced by the length of the link between the signal generator and the detector. The optimum wavelength for low absorption criteria will be less essential at short link lengths.

In the body 3 of the detector structure of the invention, the speed and sensitivity to the light delivered by the fiber 1 will be the main considerations. It is generally always desirable to have a semiconductor material with a low density of defects in order to reduce leakage currents and resulting noise.

The semiconductor materials involved should have a high band to band absorption coefficient such that much of the light delivered by the fiber through the surface 2 can be absorbed in a base layer 6 which is of the order of 0.25 to 1 micrometers thick.

While the illustration of FIGS. 1 and 2 is spread out for ease of illustration of the band energy gradients, it will be clear to one skilled in the art that there are semiconductor layer thicknesses which will optimize the light absorption characteristics, the minority carrier transit time, the noise control and the gain of the device.

Semiconductor materials having a direct energy band gap below the energy of the photons they are absorbing will have higher absorption properties for photon energies. The measure is called the absorption coefficient. A desirable high absorption coefficient will be $\gtrsim 10^4$ cm$^{-1}$ for photon energies of 0.1 electron volts or more greater than the band gap. Suitable direct band gap materials will include many of the III–V intermetallic semiconductors such as GaAs, InP, GaSb, InAs, InSb and their alloys. With respect to the contact 12, the light should be able to penetrate through the emitter region 4 to region 6 in which the absorption is to take place without first being significantly absorbed in any contacting layer. Thus, it is desirable that where the contact 12 is a layer that is transparent to the light involved it is preferable that the contact layer material have a larger band gap energy than the wave amplitude of the light.

Referring to FIG. 1, for a silicon based optical fiber such as quartz, the region 4 will be of GaAlAs which has a band gap of about 1.7 electron volts (eV). Since the band gap of the GaAlAs will be larger than 1.4 eV which is the band gap of the GaAs base region 6 at the interface 5 so that the injection efficiency and potential current gain will be high. At the interface 5, the lattice spacing of $Ga_{1-x}Al_xAs$ is matched to that of GaAs in order to minimize the formation of defects which may act as recombination centers. In the region 6, a third ingredient, In, is progressively introduced producing the semiconductor $Ga_{1-x}In_xAs$ with x progressively increasing so that a narrower band gap is produced at the base to collector p-n junction 7. In the regions 4, 6 and 8, the variation of the crystal composition is employed for band gap and lattice spacing adjustment and appropriate impurity concentration is introduced to provide the desired conductivity type.

The structure will provide strong absorption in the base region for any light with a photon energy between 0.4 and 1.7 electron volts which translates to a wavelength of between 0.7 and 3 micrometers. An effective drift field in the base for a base that is 0.5 to 1 micrometer wide will be roughly $10^4$ volts per centimeter. With such a field electrons produced will move at something approaching peak electron velocity which is in the vicinity of $5 \times 10^7$ centimeters per second and thus will have a transit time of about 1 picosecond. For a response time of $10^{-10}$ seconds, the device could have a gain of $\approx 100$.

In the collector region 8, if needed, a lattice spacing adjustment may be made by progressively decreasing x which is to decrease the quantity of the ingredient In so as to return to GaAs at interface 9 with a substrate which may be n-conductivity type GaAs.

While the above discussion has been directed toward the use of GaAlAs as the emitter material and GaInAs as the base-collector material, there are other exemplary systems available. For example, for infrared (IR) signal detection, AlSb will serve as the emitter material, with a band gap of 1.6 eV and $Ga_{1-x}In_xSb$ will serve as the base-collector material, with a band gap of 0.18 to 0.7 eV. Since $Ga_{0.9}In_{0.1}Sb$ can be lattice matched to AlSb and since the band gap of $Ga_{1-x}In_xSb$ decreases with increasing x, a substrate of GaSb is satisfactory.

In Table I there is provided an illustrative system of a list of various emitter, base-collector and substrate materials which can be used in the practice of this invention.

TABLE I

| Emitter | Base-Collector | Substrate | Detection Wavelength in Microns |
|---|---|---|---|
| $Ga_{1-x}Al_xAs$ | $Ga_{1-x}In_xAs$ | GaAs | 0.7–3 |
| AlSb | $Ga_{1-x}In_xSb$ | GaSb | 0.8–5.0 |
| GaP | $Si_{1-x}Ge_x$ | Si | 0.5–1.5 |
| $Ga_{0.5}In_{0.5}P$ | $Ga_{1-x}Al_xAs$ | GaAs | 0.6–9 |

Thus, the use of graded intermetallic semiconductor alloys permits the tailoring of the properties of the semiconductor in various regions without obtaining a high density of misfit dislocations in spite of a significant lattice mismatch between the various binary semiconductors.

What has been described is optical signal detection wherein through a combination of materials selection and of grading a third ingredient into a binary semiconductor optimum optical and structural properties are achieved.

Having thus described our invention, what we claim as new and desire to secure by Letters Patent is:

1. A transistor comprising in combination in an epitaxial layered monocrystalline structure, an emitter layer having an energy gap of a first magnitude, a base layer forming a first p-n junction with said emitter layer and having an energy gap of a second magnitude narrower than said emitter energy gap, said base energy gap decreasing with distance from said first p-n junction, a collector layer including a substrate forming a second p-n junction with said base layer, said collector energy gap increasing with distance from said second p-n junction, and an external electrical connection each to said substrate, to said base and to said emitter layer.

2. The transistor of claim 1 wherein said base and said collector layers are each of a two element semiconductor material having a third element concentration progressively changing with distance with respect to an adjacent p-n junction.

3. The transistor of claim 2 wherein said emitter layer is GaAlAs, said base layer is graded $Ga_{1-x}In_xAs$ where x is increasing with distance from said first p-n junction and said collector layer is graded $Ga_{1-x}In_xAs$ where x is decreasing with distance from said second p-n junction and said substrate layer is GaAs.

4. An optical signal detector for converting light into electrical signals comprising in combination in an epitaxial layered crystalline structure a light transmitting emitter layer having an energy gap wider than the photon energy of said light, a light absorbing base layer forming a p-n junction with said emitter layer and having an energy gap narrower than said emitter layer energy gap, said base layer energy gap decreasing with distance from the p-n junction with said emitter layer, a collector layer including a substrate forming a p-n junction with said base layer, said collector layer energy gap increasing with distance from said p-n junction with said base layer, and an external electrical connection means to each said emitter, base and collector.

5. The detector of claim 4 wherein said emitter layer is GaAlAs, said base layer is graded $Ga_{1-x}In_xAs$ wherein x is increasing with distance from said emitter to base p-n junction, said collector layer is graded $Ga_{1-x}In_xAs$ where x is decreasing with distance from said base to collector p-n junction, and said substrate is GaAs.

6. In a semiconductor signal processor of the type having emitter, base and collector intermetallic semiconductor layers, the improvement comprising the opposite variation with distance of the quantity of an additional element in base and collector layers adjacent the collector p-n junction of a transistor structure.

7. The processor of claim 6 wherein said emitter layer is of $A_{1-x}D_xB$ ingredients, said base layer is of $A_{1-x}C_xB$ ingredients, the band gap of the semiconductor of AB ingredients being greater than the band gap of the semiconductor of CB ingredients and where the lattice constant of said semiconductor $A_{1-x}D_xB$ is essentially equal to the lattice constant of said semiconductor $A_{1-x}C_xB$ at an emitter-base p-n junction and where $0 \leq x \leq 1$ and x increases with distance from said emitter-base p-n junction at the interface of said emitter and said base regions, said collector layer being of $A_{1-x}C_xB$ ingredients where the value of x decreases with distance from a base-collector p-n junction at the interface between said base and collector layers and said substrate layer being of A and B ingredients.

8. The processor of claim 7 wherein A is Ga, D is Al, C is In and B is As.

* * * * *